United States Patent [19]

Reid

[11] Patent Number: 4,660,066
[45] Date of Patent: Apr. 21, 1987

[54] STRUCTURE FOR PACKAGING FOCAL PLANE IMAGERS AND SIGNAL PROCESSING CIRCUITS

[75] Inventor: Lee R. Reid, Plano, Tex.
[73] Assignee: Texas Instruments Incorporated, Dallas, Tex.
[21] Appl. No.: 767,063
[22] Filed: Aug. 19, 1985

Related U.S. Application Data

[63] Continuation of Ser. No. 415,787, Sep. 8, 1982.
[51] Int. Cl.⁴ .......................................... H01L 27/14
[52] U.S. Cl. ....................................... 357/30; 357/31; 357/32; 357/24 LR; 357/40; 357/45; 357/20; 250/332; 250/330; 250/370
[58] Field of Search .................... 357/30, 30 D, 30 G, 357/30 H, 30 I, 30 J, 30 E, 31, 32, 24 LR, 40, 45, 20; 250/332, 330, 370 G

[56] References Cited

U.S. PATENT DOCUMENTS

| | | | |
|---|---|---|---|
| 3,179,542 | 4/1965 | Quinn et al. | 357/45 X |
| 3,742,238 | 6/1973 | Hoffman, II | 250/332 |
| 3,963,926 | 6/1976 | Borrello | 350/332 X |
| 4,030,116 | 6/1977 | Blumenfeld | 357/32 |
| 4,039,833 | 8/1977 | Thom | 357/45 X |
| 4,257,057 | 3/1981 | Cheung et al. | 250/370 G X |
| 4,441,791 | 4/1986 | Hornbeck | 357/30 X |
| 4,566,024 | 1/1986 | Fleury et al. | 357/30 X |

FOREIGN PATENT DOCUMENTS

| | | | |
|---|---|---|---|
| 0022486 | 1/1981 | European Pat. Off. | 357/30 D |
| 55-68684 | 5/1980 | Japan | 357/30 H |
| 55150929 | 5/1982 | Japan | 357/30 B |
| 0073984 | 5/1982 | Japan | 357/30 B |

OTHER PUBLICATIONS

Kohn et al., "1-2 Micron (Hg, Cd) Te Photodetectors," *IEE Transactions on Electron Devices*, vol. ED-16, No. 10, Oct. 1969, pp. 885-890.

Primary Examiner—Martin H. Edlow
Assistant Examiner—William A. Mintel
Attorney, Agent, or Firm—Carlton H. Hoel; James T. Comfort; Melvin Sharp

[57] ABSTRACT

An image focal plane array is disclosed including a first substrate having a first surface containing image detection elements that are interconnected to metallized layers on the opposite surface. The first substrate area is located above a second semiconductor substrate containing elevated portions that are metal coated and contacting the metallized portions on the opposite surface of the the first substrate to provide for electrical interconnection with the detection elements on the first substrate. A second structure is also illustrated which includes the image focal point array located on a cold finger and adjacent to the image focal plane array on the same cold finger is a stack of at least two silicon substrates containing support circuitry for the focal plane array. The circuitry on these semiconductor substrate stacks are interconnected by having at least one of the substrates including elevated portions to provide electrical interconnection between the two or more stack substrates.

18 Claims, 16 Drawing Figures

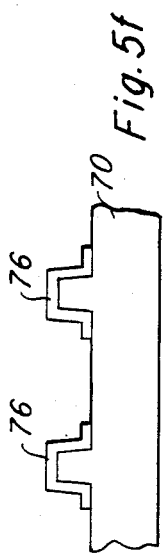
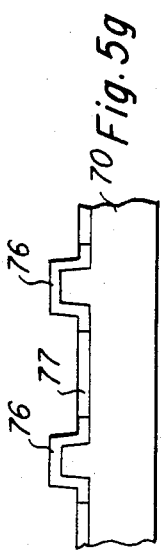
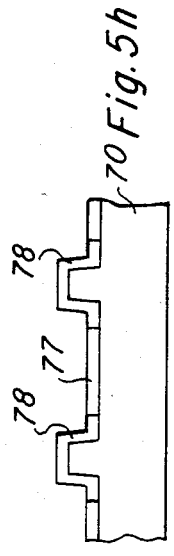
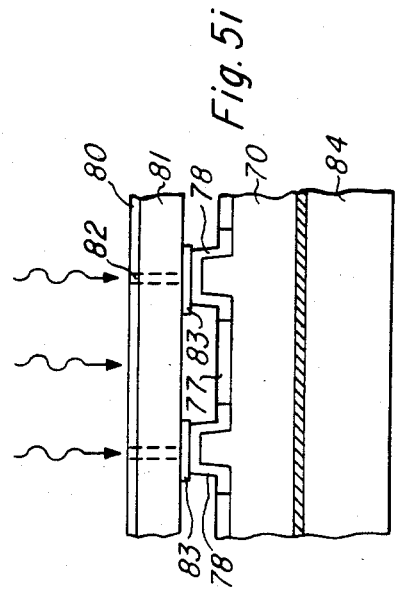
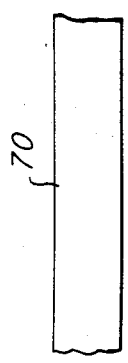
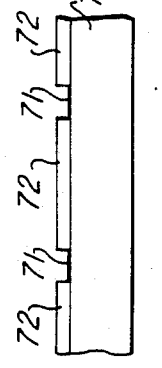
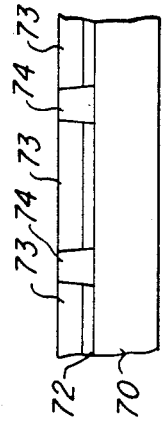
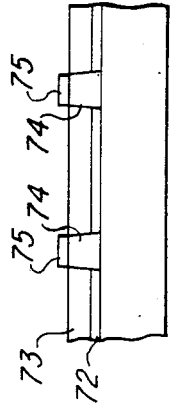

4,660,066

STRUCTURE FOR PACKAGING FOCAL PLANE IMAGERS AND SIGNAL PROCESSING CIRCUITS

This application is a continuation of application Ser. No. 415,787, filed 9/8/82.

RELATED APPLICATIONS

The following applications are related to the present application: U.S. patent application Ser. No. 384,453, filed June 3, 1982, entitled "Solid State Multiprobe Testing Apparatus", U.S. patent application Ser. No. 384,454, filed June 3, 1982, entitled "Solid State Interconnection System for Three Dimensional Integrated Circuit Structures; U.S. patent application Ser. No. 384,378, filed June 3, 1982, entitled "Interconnection of Surfaces For Semiconductor Devices", U.S. patent application Ser. No. 384,451, filed June 3, 1982, entitled "Solid State Three Dimensional Semiconductor Memory Array", U.S. patent application Ser. No. 415,783, filed Sept. 8, 1982, entitled "A Method for Fabricating a Semiconductor Interconnect Structure Using Orientation Dependent Etching and Thermal Migration", and U.S. patent application Ser. No. 416,396, filed Sept. 8, 1982, entitled "Direct Connection of Image Array to Processing Circuitry".

BACKGROUND OF THE INVENTION

1. Field of the Invention

This invention relates to image array circuitry and more specifically to the structure of the image plane circuitry with the supporting circuitry on silicon substrates.

2. Description of the Prior Art

Focal plane arrays such as an infrared focal plane array are normally implemented using an array of detection elements on some substrate surfaces that are bonded electrically to support circuitry surrounding the array itself. The number of substrates surrounding the image array is usually determined by the number of detection elements on the image array itself. Since the support circuitry must be physically located adjacent to the image array itself, the area around the array must be structured to support this additional circuitry. This, in turn, acts as a limit to the size of the focal plane array itself.

It is the object of this invention to provide a structure that allows for the support circuitry to be formed as a three dimensional structure allowing for a greater area to be provided for the focal plane array itself and to require a smaller cold finger to cool the assembly.

SUMMARY OF THE INVENTION

In accordance with the present invention, an image focal plane array structure is provided that includes a first substrate having two surfaces and including an array of image detection elements located upon the first surface and electrically connected to electrically conductive material located upon the second surface. Located below the first substrate is a second substrate containing elevated surfaces. The elevated surfaces further contain electrically conductive material that is physically and electrically connected to the electrically conductive material of the second surface of the first substrate. The second substrate contains circuitry that interacts with the image detection elements on the first surface of the first substrate.

In a preferred embodiment in an infrared focal plane array is illustrated that includes a first substrate with the infrared detection elements located upon the first surface of the first substrate and electrically connected to a second substrate containing support circuitry. The detection elements on the first surface are electrically interconnected to conductive regions on the second surface of the first substrate. These conductive regions on the second surface of the first substrate are electrically and physically interconnected to elevated portions of the second substrate. The elevated portions on the surface of the second substrate are in turn electrically connected to the circuitry contained upon either surface of the second substrate.

In a second embodiment of the present invention, an infrared focal plane array is located upon a cold finger. Adjacent to the array is a stack of at least two or more semiconductor substrate surfaces that are connected to the focal plane array by metal bonding wires. The semiconductor substrates are interconnected between each other by the physical location of one substrate above a second substrate connecting to the elevated portions of the substrate below. These elevated portions provide electrical interconnection between the two or more substrates allowing for the electrical interconnection of circuitry contained on the two or more substrates.

BRIEF DESCRIPTION OF THE DRAWINGS

The novel features believed characteristic of this invention are set forth in the appended claims. The invention itself, however, as well as other features and advantages thereof will be best understood by reference to the detailed description which follows in conjunction with the accompanying drawings:

FIG. 5a is the cross-sectional view of a silicon slice.

FIG. 5b is a cross-sectional view of a silicon slice with an oxide defined surface.

FIG. 5c is a cross-sectional view of a silicon slice with mesas grown in the oxide formed areas.

FIG. 5d is a cross-sectional view of a silicon slice with the mesas formed together with an oxide covering the top portion of the mesas.

FIG. 5e is a cross-sectional view of a the silicon slice with the mesas completely formed and exposed.

FIG. 5f is a cross-sectional view of a silicon slice with the mesas formed and protected by an oxide coating.

FIG. 5g is a cross-sectional view of the silicon slice with the mesas formed with circuitry fabricated between the mesas.

FIG. 5h is a cross-sectional view of a silicon slice with circuitry upon the surface electrically interconnected to metallized areas located on the surface of the mesas.

FIG. 5i is a cross-sectional view of the focal plane array positioned on top of a silicon slice which in turn is positioned on top of the cold finger.

DESCRIPTION OF THE INVENTION

Figure 1:
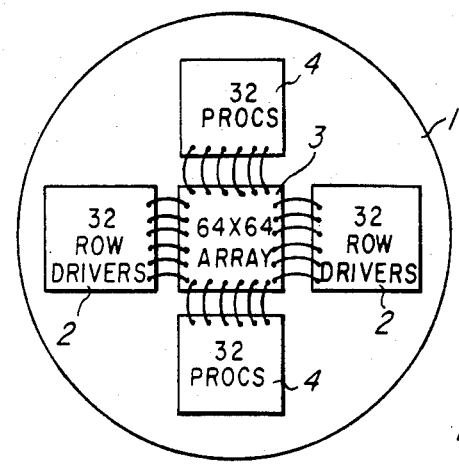
FIG. 1 is the top view of an image array with the supporting circuitry located on a cold finger.

The imager structure normally includes an array of photosensitive cells that are connected to several support circuits. FIG. 1 illustrates the structure of an infrared focal plane array connected with several support circuits on top of a cold finger 1. The cold finger 1 provides cooling for the infrared focal plane array for increased sensitivity of the array to detected infrared radiation. The structure in FIG. 1 is known in the prior art and implemented in current infrared imagers. Referring to FIG. 1, an infrared focal plane array 3 is located in the center of the cold finger 1. This particular array 3 contains a matrix of 64×64 infrared detection cells. These cells are addressed by rows and columns. The rows are addressed by one of the 32 row drivers 2 that are located beside the infrared focal plane array 3 on cold finger 1 as shown. Note that these row drivers 2 are physically interconnected to the infrared focal plane array 3 by the wires shown. The wiring interconnect allows the row drivers 2 to individually address rows on the infrared focal plane array 3. The columns on the infrared focal plane array 3 are addressed by one of the two signal processors 4 located on the cold finger 1. The purpose of the signal processors 4 is to address and receive the information from each of the infrared sensing elements in the infrared focal plane array 3 and convert this information into digital signals to be transmitted to circuitry elsewhere. It is often customary to take the digital words representing the contents of the focal plane array image and to convert this image into a picture for display on a cathode ray tube for viewing by an observer. In the structure shown in FIG. 1, the signal processors 4 must also be individually wire bonded to the focal plane array 3 in a manner similar to that of the row drivers 2.

Figure 2:
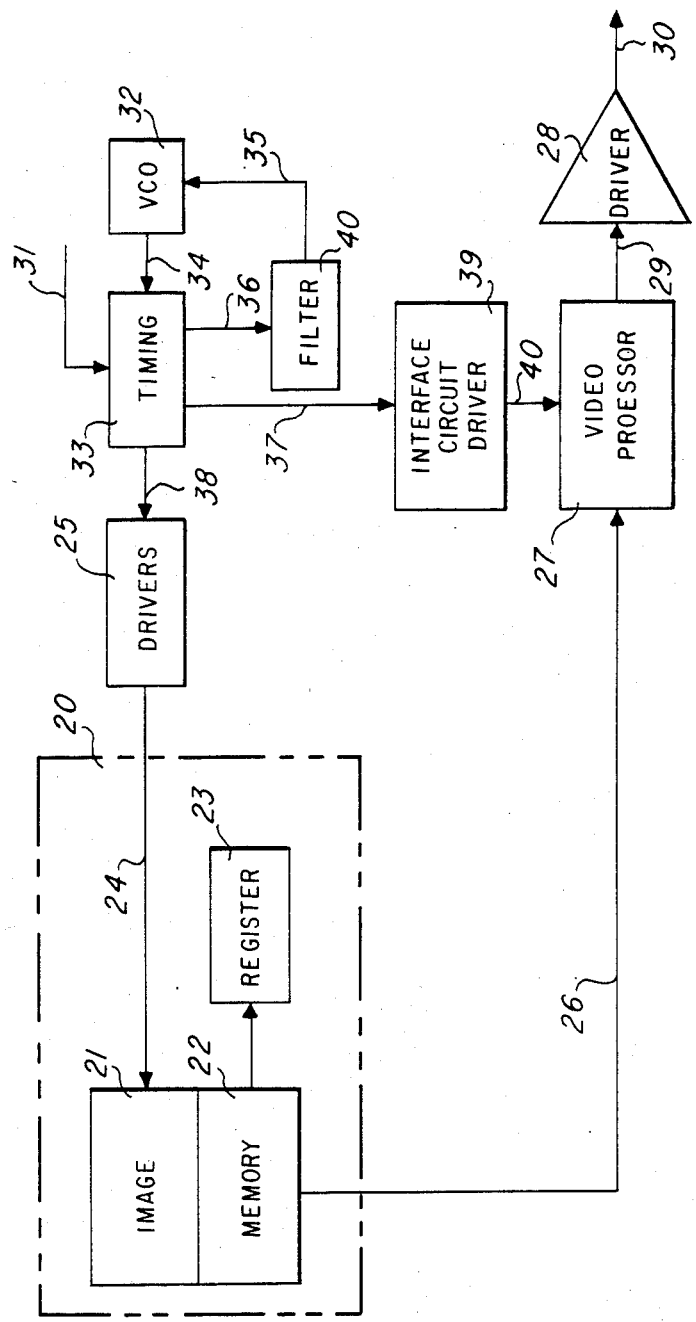
FIG. 2 is a block diagram of the image array and supporting circuitry.

The infrared focal plane array and supporting circuitry as illustrated in a block diagram in FIG. 2. This specific block diagram represents merely a representative block diagram of an infrared focal plane array system. The actual focal plane array is shown as a silicon chip 20. The image array 21 contains the matrix of infrared sensitive elements. The images received by these elements are transferred to another similar array 22, which stores the information from the image array 21 and outputs this information by a line 26 to the video processor 27 upon command of the video processor. In typical applications, the image array 21 will contain 390 pixels by 292 pixels, and the memory 22 array will likewise be 390 pixels by 292 pixels. The purpose of the serial register 23 is to read data out of the memory half of the CCD imager and send it to the video processor 27. The rows of the image array 21 are addressed by the line drivers 25 over line 24. The timing for this circuit originates in a phase locked loop circuit in block 33 which is connected by line 36 to a loop filter 40 which is fed back into a variable oscillator 32 such as SN 74327 which provides the initial timing on line 34 to phase locked loop timing circuit 33. An external synchronization signal on line 31 may also be provided to the timing circuit. The timing is also provided by a line 37 to an interface circuit driver 39 that interfaces directly by line 40 to the video processor 27. Again, the purpose of the video processor 27 is to read the image in the memory array 22 and convert this information on line 26 into a video signal that is output on line 29 and interfaced to external circuitry by driver 28 on to line 30. It is the object of this present invention to provide a structure that allows at least a portion of the circuitry contained in FIG. 2 to be physically adjacent to the actual infrared image array.

Figure 3:
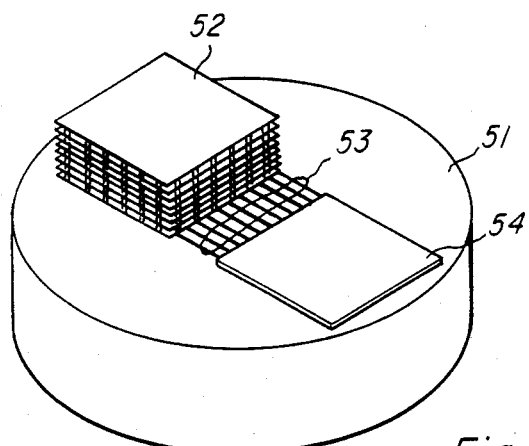
FIG. 3 is an isometric view of an image array and supporting circuitry structure located on a cold finger.

FIG. 3 illustrates one structure that would allow the support circuitry to be adjacent to the image array located upon a cold finger 51. The timing circuitry, signal processor and driving circuitry is located in the stack of silicon chips 52 that are connected by a wiring 53 to the imager array 54. Notice the surface area savings on the cold finger 51 by use of the stacking of the support circuitry as opposed to the layout of the support circuitry with the image array in FIG. 1.

Figure 4:
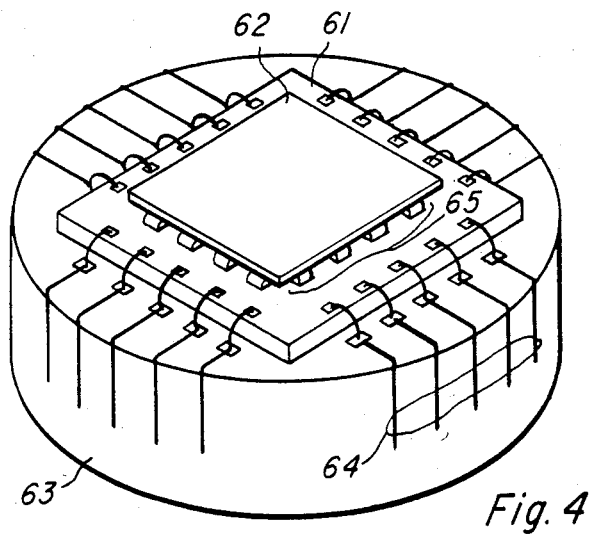
FIG. 4 is an isometric view of an alternate physical structure of the detector array and supporting circuitry.

In another embodiment the support circuitry for the image array may be located on a single silicon chip located beneath the infrared focal plane array as shown in FIG. 4. The cold finger 63 contains the single silicon chip 61. On top of the silicon chip 61 is the infrared focal plane array 62. Note that the infrared focal plane array chip 62 is connected by a series of mesas 65 to the silicon chip 61. Silicon chip 61 is then connected to external circuitry by wiring 64 located on the surface of the cold finger 63. The physical structure of the silicon chips such as 61 and the stacked structure 52 in FIG. 3 utilize the mesa structure of the silicon chip. One method of constructing these mesas is contained in said U.S. patent application Ser. No. 384,454, entitled "Solid State Interconnection System for Three Dimensional Integrated Circuit Structures". That application describes a technique for forming mesas using orientation dependent etching (ODE) of the silicon surface.

A second method of forming mesas is orientation dependent deposition (ODD) as illustrated in FIG. 5. FIG. 5a illustrates a cross section of a slice of silicon 70 in a 111 orientation. FIG. 5b illustrates an oxide defined mesa base deposited on top of the silicon 70. The oxide layer 72 defines open areas 71 which will become the base of the mesas. FIG. 5c illustrates the growth of the mesas. This growth is accomplished by vapor phase epitaxy for the simultaneous growth of the epitaxial mesas 74 and polysilicon layers 73. The polysilicon layers are multiple crystalline silicon layers deposited on top of the oxide regions 72. The epitaxial growth, however, is a single crystal silicon growth based on the silicon slice 70. The simultaneous growth of epitaxial single crystal silicon and polysilicon occurs when the vapor phase comes in contact with the single crystal substrate 71 and the oxide coating 72. FIG. 5d illustrates the addition of a top layer of oxide 75 on top of the epitaxial grown mesas 74. FIG. 5e illustrates the etching of the polysilicon 73 from the slice 70 and the removal of the oxide layers 72 and 75. It should be noted that if a polysilicon selective etch is used, the oxide mesa covers 75 illustrated in FIG. 5d may not be required. FIG. 5f illustrates the covering of the mesas 74 with oxide 76 to protect the mesas during the formation of circuitry on the silicon surface. FIG. 5g illustrates the formation of the circuits 77 on the surface of the silicon chip 70. FIG. 5h illustrates the formation of metal contacts 78 on the surface of the mesas 74 and the remaining circuitry 77 on the surface of the silicon chip 70. FIG. 5i illustrates the three-dimensional interconnection of the infrared focal plane array 80 and 81 is interconnected to the silicon circuitry on the silicon slice 70 located above the cold finger 84. Note that the infrared focal plane array surface 80 is interconnected by interconnection leads 82 to metallized surfaces 83 on the base of the focal plane array 81. These metal surfaces further interconnect to the metallization 78 on the mesas of the silicon slice 70. These metallizations 78 of the mesas are interconnected to the circuitry 77 on the surface of slice 70. The slice 70 is located above the cold finger 84. The cold finger 84 provides cooling to the infrared focal plane 81 through the silicon slice 70 and the metallized areas 78 and 83. A thermal conducting substance may be injected between the silicon substrate 70 and the detector array 81 to increase thermal cooling of the detector array if necessary.

The interconnection between the two surfaces of a silicon chip or wafer is described in said U.S. patent application Ser. No. 384,378 entitled "Interconnection of Surfaces for Semiconductor Devices" herein incorporated by reference. This application describes the formation of a hole through the silicon wafer using orientation dependent etching. Other methods of forming holes through the silicon wafers are described in the paper "Forming Electrical Interconnections Through Semiconductor Wafers" by T. R. Anthony published in the *Journal of Applied Physics,* Vol. 52, No. 8, August 1978, pgs. 5340-5349. This paper describes several techniques for forming holes through the semiconductor wafer and using another paper entitled "Silicon as a Mechanical Material" by Kirk E. Peterson, published in *The Proceedings of the I.E.E.E.,* No. 5, May 1982. Pages 420-457 discuss many mechanical properties of silicon material. In this article, a technique called thermomigration is described that provides for the formation of conductor material through the silicon slice to interconnect the two surfaces of a wafer. The technique of forming holes in silicon wafers using laser drilling or similar techniques to form parallel hole in the silicon wafer together with thermo migration may be used to form these interconnects.

Figure 6:
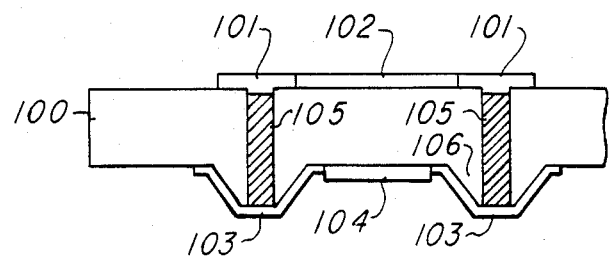
FIG. 6 is a cross-sectional view of a silicon slice with mesas connected to circuitry on both surfaces.

FIG. 6 illustrates how these interconnections can be utilized with the mesas formed by orientation dependent etching or orientation dependent deposition to provide for a silicon wafer with circuitry formed on both sides that is interconnected. Referring to FIG. 6, the silicon wafer 100 contains circuitry 102 implemented on the top side of the silicon wafer 100 surface that is connected to metallized layers 101. These metallized layers 101 are electrically connected to the conductors 105 formed by thermomigration. These conductors 105 are also interconnected electrically to the metallized areas 103 on mesas 106. The metallized areas 103 are also interconnected to circuitry 104 formed on the bottom surface of the silicon wafer 100. This type of structure not only provides the interconnection of circuits 102 and 104, but also provides for the interconnection of silicon wafers 100 with other silicon wafer. In this manner the stack structure 52 illustrated in FIG. 3 may be formed.

Figure 7:
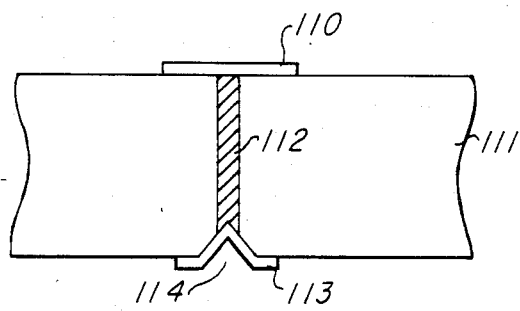
FIG. 7 is a cross-sectional view of a silicon slice with an orientation dependent etched via formed together with a thermomigration interconnection between surfaces.

FIG. 7 illustrates a further embodiment using thermomigration and orientation dependent etching to form an interconnection structure in a silicon wafer. The n-type silicon wafer 111 contains a metallized interconnection 112 that has been formed by thermomigration using an aluminum silicon alloy. The area 114 was formed by using an orientation dependent etch. This area is covered with a metallized layer 113 to provide interconnection to either electrical circuits on that substrate or to exterior probe interconnections. The metallized layer 110 formed on top of the interconnect 112 is fabricated for interconnection to any circuitry that may be fabricated on that surface of the semiconductor substrate 111.

Figure 8:
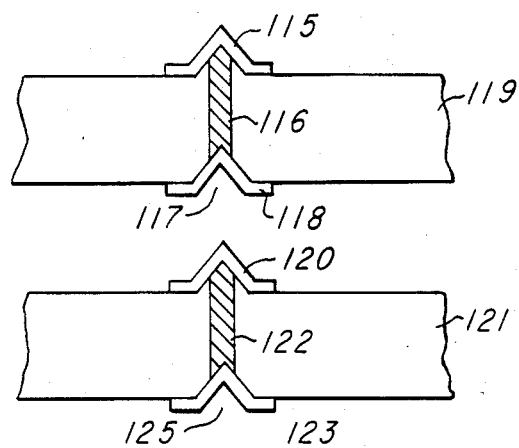
FIG. 8 is a cross-sectional view of two silicon slices, both with thermomigration formed interconnections together with orientation dependent etched vias and surface mesas.

FIG. 8 illustrates the interconnection of two substrates formed in a manner described for FIG. 7. In FIG. 8 the two substrates 119 and 121 both have elevated areas formed that are covered with metallized layers 115 and 120, respectively. These elevated layers are formed by orientation dependent etching as previously discussed. The interconnection in the substrates between the surfaces such as 116 for substrate 119 and 122 for substrate 121 are formed by thermomigration of an aluminum silicon alloy. The orientation dependent etch technique has also been used to form indentations in the substrates such as area 117 for substrate 119 and 125 for substrate 121. These areas have been covered by metal coatings 118 and 123, respectively. This combination of orientation dependent etching with the metallized coating and thermomigration interconnection provides for the mating of two silicon wafers 119 and 121 in the manner shown by joining the orientation dependent etched protruding layer of substrate 121 with metal coating 120 against the orientation dependent etched via indentation area 117 with metal coating 118 of substrate 119. In this manner, the substrates may be stacked on top of each other providing electrical interconnections between the substrate surfaces themselves and between the surface of one substrate and the surface of another substrate.

I claim:
1. An image focal plane array structure, comprising:
   (a) a first semiconductor substrate having a first and second surface,
   (b) an array of image detection elements located upon said first surface,
   (c) electrically conductive material disposed on said first surface, connected to said image detection elements and extending through said first semiconductor substrate to said second surface,
   (d) at least one second semiconductor substrate having a third and a fourth surface, said third surface including portions of semiconductor material integral with said substrate material and extending therebeyond out of said substrate and defining electric circuit means between said portions, and
   (e) electrically conductive material disposed on said portions and coupled to said electric circuit means,
   (f) said electrically conductive material disposed on said portions being in intimate contact with said electrically conductive material on said second surface.

2. An image focal plane array according to claim 1 wherein said second substrate includes a single crystal silicon substrate.

3. An image focal plane array according to claim 1 wherein said second substrate includes circuit means fabricated on both surfaces of the silicon substrate.

4. An image focal plane array according to claim 1, further including electrically conductive means disposed on said third surface and extending to said fourth surface and circuit means on said fourth surface connected to said electrically conductive means extending to said fourth surface.

5. An image focal plane array according to claim 1, wherein said portions have a predetermined shape, said fourth surface having indentations of a shape complementary to said portions whereby said portions are matable with indentations of a further substrate to provide stacking of substrates.

6. An image focal plane array according to claim 1, wherein said portions have a predetermined shape, said fourth surface having indentations of a shape complementary to said portions whereby said portions are matable with indentations of a further substrate to provide stacking of substrates.

7. An image focal plane array according to claim 5, further including said further substrate as substantially identical to said second substrate, portions on third side of said further substrate mating with said indentations of said second substrate.

8. An image focal plane array according to claim 6, further including said further substrate as substantially identical to said second substrate, portions on third side of said further substrate mating with said indentations of said second substrate.

9. An image focal plane array according to claim 2, further including electrically conductive means disposed on said third surface and extending to said fourth surface and circuit means on said fourth surface connected to said electrically conductive means extending to said fourth surface.

10. An image focal plane array according to claim 2, wherein said portions have a predetermined shape, said fourth surface having indentations of a shape complementary to said portions whereby said portions are matable with indentations of a further substrate to provide stacking of substrates.

11. An image focal plane array according to claim 9, wherein said portions have a predetermined shape, said fourth surface having indentations of a shape complementary to said portions whereby said portions are matable with indentations of a further substrate to provide stacking of substrates.

12. An image focal plane array according to claim 10, further including said further substrate as substantially identical to said second substrate, portions on third side of said further substrate mating with said indentations on said second substrate.

13. An image focal plane array according to claim 11, further including a further substrate substantially identical to said second substrate, portions on third side of said further substrate mating with said indentations of said second substrate.

14. An image focal plane array according to claim 3, further including electrically conductive means disposed on said third surface and extending to said fourth surface and circuit means on said fourth surface connected to said electrically conductive means extending to said fourth surface.

15. An image focal plane array according to claim 3, wherein said portions have a predetermined shape, said fourth surface having indentations of a shape complementary to said portions whereby said portions are matable with indentations of a further substrate to provide stacking of substrates.

16. An image focal plane array according to claim 14, wherein said portions have a predetermined shape, said fourth surface having indentations of a shape complementary to said portions whereby said portions are matable with indentations of a further substrate to provide stacking of substrates.

17. An image focal plane array according to claim 15, further including said further substrate as substantially identical to said second substrate, portions on third side of said further substrate mating with said indentations of said second substrate.

18. An image focal plane array according to claim 16, further including said further substrate a substantially identical to said second substrate, portions on third side of said further substrate mating with said indentations of said second substrate.

* * * * *